(12) United States Patent
Kotowicz

(10) Patent No.: US 10,477,714 B2
(45) Date of Patent: Nov. 12, 2019

(54) PRESSURE COMPENSATION ELEMENT HAVING SPRING ELEMENT, CASING AND ELECTRONIC CONTROL DEVICE

(71) Applicant: Continental Automotive GmbH, Hannover (DE)

(72) Inventor: Edward Kotowicz, Tergernheim (DE)

(73) Assignee: Vitesco Technologies GmbH, Hannover (DE)

( * ) Notice: Subject to any disclaimer, the term of this patent is extended or adjusted under 35 U.S.C. 154(b) by 301 days.

(21) Appl. No.: 15/302,906

(22) PCT Filed: Mar. 24, 2015

(86) PCT No.: PCT/EP2015/056314
§ 371 (c)(1),
(2) Date: Oct. 7, 2016

(87) PCT Pub. No.: WO2015/154996
PCT Pub. Date: Oct. 15, 2015

(65) Prior Publication Data
US 2017/0042052 A1 Feb. 9, 2017

(30) Foreign Application Priority Data
Apr. 8, 2014 (DE) .................. 10 2014 206 735

(51) Int. Cl.
*H05K 5/06* (2006.01)
*H05K 5/02* (2006.01)

(52) U.S. Cl.
CPC ........... *H05K 5/068* (2013.01); *H05K 5/0213* (2013.01)

(58) Field of Classification Search
CPC ...... H05K 5/0213; H05K 5/068; B01D 69/02; B65D 51/1616
(Continued)

(56) References Cited

U.S. PATENT DOCUMENTS 4,745,941 A * 5/1988 Nilsson .................. F23L 7/007
137/114
5,522,769 A 6/1996 DeGuiseppi
(Continued)

FOREIGN PATENT DOCUMENTS

CN 101584260 11/2009
CN 102860147 A 1/2013
(Continued)

OTHER PUBLICATIONS

International Search Report and Written Opinion dated Jul. 2, 2015 from corresponding International Patent Application No. PCT/EP2015/056314.
(Continued)

*Primary Examiner* — James N Smalley
*Assistant Examiner* — Madison L Poos

(57) ABSTRACT

A pressure compensation element for casings includes a connecting body in the form of a hollow body, a membrane seat having a contact surface for a membrane and an impact protection device. The membrane seat is arranged on the connecting body wherein the impact protection device is coupled to the connecting body. The membrane is arranged on the contact surface between the impact protection means and the membrane seat. The connecting body has a first opening arranged on a first free end, and a second opening leading to the contact surface of the membrane seat, wherein a spring element is arranged inside the second opening abutting the contact surface. The spring element provides a support contour for the membrane.

20 Claims, 3 Drawing Sheets

(58) Field of Classification Search
USPC .................... 220/367.1, 745, 203.11, 371
See application file for complete search history.

(56) References Cited

U.S. PATENT DOCUMENTS

| | | | | |
|---|---|---|---|---|
| 6,770,062 | B2* | 8/2004 | Phung | A61M 1/0023 |
| | | | | 137/116.3 |
| 7,166,024 | B2* | 1/2007 | Mashiko | F21V 31/03 |
| | | | | 454/370 |
| 8,821,226 | B2* | 9/2014 | Yano | B65D 77/225 |
| | | | | 454/143 |
| 9,061,811 | B2* | 6/2015 | Egersdoerfer | B65D 77/225 |
| 2002/0090506 | A1* | 7/2002 | Protzner | C25D 5/56 |
| | | | | 428/334 |
| 2012/0048871 | A1 | 3/2012 | Chiu | |

FOREIGN PATENT DOCUMENTS

| | | |
|---|---|---|
| DE | 3933877 A1 | 4/1990 |
| EP | 1363484 A2 | 11/2003 |
| EP | 2269874 A1 | 1/2011 |
| EP | 2280222 A2 | 2/2011 |
| EP | 2455643 A1 | 5/2012 |
| EP | 2679515 A1 | 1/2014 |
| WO | 2008/077667 A2 | 7/2008 |

OTHER PUBLICATIONS

Chinese Office Action dated Aug. 2, 2018 for corresponding Chinese application No. 201580018153.1.

* cited by examiner

PRESSURE COMPENSATION ELEMENT HAVING SPRING ELEMENT, CASING AND ELECTRONIC CONTROL DEVICE

FIELD OF THE INVENTION

The invention concerns a pressure compensation element according to claim 1.

BACKGROUND

Electrical devices in tightly closed casings, such as for example an engine control unit, are freely exposed to environmental influences. In active state, these devices heat the air inside the casing. This expands and leads to a positive pressure inside the casing. When the electrical devices are then switched off, they cool down and the interior pressure falls. In principle, the exterior temperature can change substantially more quickly than in a well-sealed casing, for example in sudden, severe summer thunderstorms. In airtight electrical casings, such temperature fluctuations firstly lead to condensation and secondly the seals are stressed by the increased and reduced pressure, so that the seal protection is weakened over time. A further problem is that on a reduced pressure inside the casing, additional moisture can be drawn into the inside. Since the moisture cannot easily escape again, it can precipitate on the casing when temperature differences occur between the casing interior and the environment, and in some cases collect on the base. On repeated temperature fluctuations, the water quantity can increase over time and damage the installation, leading to corrosion and short-circuits. Depending on application, failure of the installed components and devices may cause serious damage.

Pressure compensation elements serve to ventilate electrical devices in tightly closed casings such as are used for example in motor vehicle construction. Such pressure compensation elements largely prevent the penetration of water into the casing interior, but allow a compensation for example of pressure differences between the internal air and the environment due to temperature changes. From the prior art, pressure compensation elements are known wherein a gas-permeable membrane is glued or welded directly onto a bore present on the casing of the electrical device. To protect the membrane, in addition a covering label or cap is glued or stuck directly onto the membrane. It has proved disadvantageous that the membrane can lose its permeability due to various solid body particles, such as for example dust and dirt, whereby faults and failures of the electrical devices can occur. Replacing the membrane is either totally impossible or complicated, cost-intensive and time-consuming.

Furthermore, pressure compensation elements are known which have base bodies with a membrane welded or glued directly onto the base body. Such pressure compensation elements are applied to the casing with separate sealing elements. In addition to the above-mentioned problem of the welded or glued membrane, it has proved problematical that, for example, during installation sealing elements can be forgotten and/or the entire pressure compensation element installed incorrectly. Installation of the pressure compensation element or replacement of the membrane is cost-intensive and a source of possible installation errors, whereby again faults and failures of the electrical devices can result.

WO 2008/077667 A2 proposes a pressure compensation element which has a pot-like cover element with a base surface and a wall, and an adapter inserted in the cover element which has a continuous bore. The opening of the bore is covered by a membrane which is attached to the top end face of the adapter. An air passage is formed between the inner wall of the cover element and the outer wall of the adapter, and between the base surface of the cover element and the bore of the adapter. The membrane is supported by webs applied in a cross pattern in the bore to prevent the membrane from folding.

SUMMARY OF THE INVENTION

It is an object of the invention to propose an improved pressure compensation element for casings, in particular for casings with electrical devices, which in particular avoids the above-mentioned disadvantages, guarantees a reliable pressure compensation and/or is economical and simple to produce.

This object is achieved by means of a pressure compensation element according to claim 1. Advantageous embodiments are given in the dependent claims.

To achieve this object, according to one aspect a pressure compensation element for casings is specified. According to a further aspect, a casing with the pressure compensation element is specified.

The pressure compensation element has a connecting body in the form of a hollow body, a membrane seat having a contact face for a gas-permeable membrane, and an impact protection. The membrane is arranged on the contact face between the impact protection and the membrane seat.

The membrane seat is arranged on the connecting body. For example, the membrane seat is formed by a part of the connecting body.

The impact protection is coupled to the connecting body. For example, the impact protection is coupled to the connecting body by means of a hinge, e.g. by means of a film hinge. The connecting body and the impact protection may be formed integrally. In one embodiment, the impact protection is a lid which at least in places covers the contact face of the membrane seat and the membrane.

The connecting body has a first opening arranged on a first free end, and a second opening leading to the contact face of the membrane seat. The two openings constitute in particular end portions of a cavity penetrating the hollow body. The pressure compensation element is in particular configured for the exchange of gas between the casing interior and the casing environment through the cavity.

A spring element is arranged inside the second opening, abutting the contact face, which spring element forms a supporting contour for the membrane. In particular, the membrane covers the second opening completely and preferably lies on the supporting contour. The spring element can in particular be deflected elastically by the membrane.

When a reduced pressure occurs in the casing interior, the membrane is pressed into the second opening, whereby a force is exerted on the spring element. In other words, the membrane is curved inward into the cavity under the elastic deformation of the spring element when the pressure in the cavity is lower than the pressure on a side of the membrane facing away from the cavity. A pressure in the cavity lower than the pressure on the side of the membrane facing away from the cavity corresponds to a reduced pressure in the cavity relative to the pressure on the side of the membrane facing away from the cavity. Such a reduced pressure may be provoked or reinforced for example when the gas exchange through the membrane is hindered because of dirt particles on the membrane. When the reduced pressure in the cavity diminishes—for example due to the air in the interior of the casing heating up—the membrane is pressed back into its starting state under the spring force of the spring element.

The spring element thus firstly provides a good contact face for the membrane, and secondly the spring element ensures that the membrane, following a reduced pressure in the casing interior caused by dirt particles on the membrane, is pressed back into its starting state so that the particles deposited on the membrane are in motion and break down. This promotes the detachment of the dirt particles from the membrane. In this way, the membrane cannot become permanently charged with dirt particles and has a longer life, so that a more sustained and economical pressure compensation between the casing interior and the ambient air can be guaranteed. Advantageously, the pressure compensation element is also suitable for use in severely contaminated environments.

In a further embodiment, the supporting contour of the spring element and the contact face of the membrane seat lie in one surface. The supporting contour and the contact face may both be contained in one plane. Alternatively, the supporting contour of the spring element and the contact face of the membrane seat may be configured curved so that they are contained together in a curved surface. Suitably, the membrane may in a starting state be curved corresponding to the face, i.e. corresponding to the supporting contour of the spring element and the contact face of the membrane seat, so that it lies by form fit on the supporting contour of the spring element and the contour face of the membrane seat and is supported thereby. The starting state in particular corresponds to a pressure-balanced configuration, i.e. the same pressure prevails on both opposing main faces of the membrane. In principle, embodiments are conceivable in which the supporting contour of the spring element, the contact face of the membrane seat and the membrane have a single curvature or multiple curvatures, wherein a single curvature for example may mean a cylindrical curvature, and a multiple curvature may for example be a spherical curvature. Preferably, the surface is free from hyperbolic points, i.e. each point on the surface is an elliptical point (both main curvatures have the same prefix), a parabolic point (one of the main curvatures is equal to zero), or a flat point (both main curvatures are equal to zero). For example, the surface is convex.

In a further embodiment, the impact protection lies at least in portions on the membrane and thus constitutes a positional fixing of the membrane. Furthermore, in this way the gas-permeable membrane is protected as far as possible from dirt particles. The positional fixing allows the membrane to be arranged reliably and securely between the membrane seat and the impact protection without the need for welding or gluing of the membrane. In this way, the membrane can be replaced easily, quickly and economically.

Advantageously, the hollow body has at least one sealing element between the first opening and the membrane seat, wherein the sealing element is configured to seal the connecting body against the casing. Here it is particularly advantageous if the first opening on the hollow body has at least one catch element for fixing the pressure compensation element to the casing, whereby in a simple fashion the seat of the connecting body on the casing can be secured. The sealing element is in particular configured integrally with the hollow body.

Preferably, the membrane seat, the membrane and the impact protection each have a rectangular outer contour, whereby a particularly simple, economical and efficient production of the membrane can be guaranteed. In particular, a particularly large part of the membrane material can be used in production. Compared with a round membrane form, a greater elasticity can be achieved by the rectangular surface.

In an advantageous embodiment, the spring element is formed between two mutually opposing regions of the second opening such that, on a reduced pressure in the casing interior, in particular caused or aggravated by dirt particles on the membrane, the spring element is pressed into the second opening by the membrane, wherein when the reduced pressure in the interior of the casing diminishes—for example because the air inside the casing heats up—the membrane is pressed back into its starting state by the spring element. In this way, the dirt particles deposited on the membrane are moved and break down, restoring the permeability of the membrane.

In one embodiment, in top view onto the second opening, the spring element has an S-shape or at least an S-shaped portion.

In a further advantageous embodiment, the first opening and the second opening lie opposite each other at the two ends of the hollow body, so that a pressure compensation between the casing interior and the ambient air can be achieved with particularly little disruption.

BRIEF DESCRIPTION OF THE FIGURES

Further features, possible applications and advantages of the invention arise from the following description of the exemplary embodiment of the invention in connection with figures. These show.

DETAILED DESCRIPTION

Figure 1:
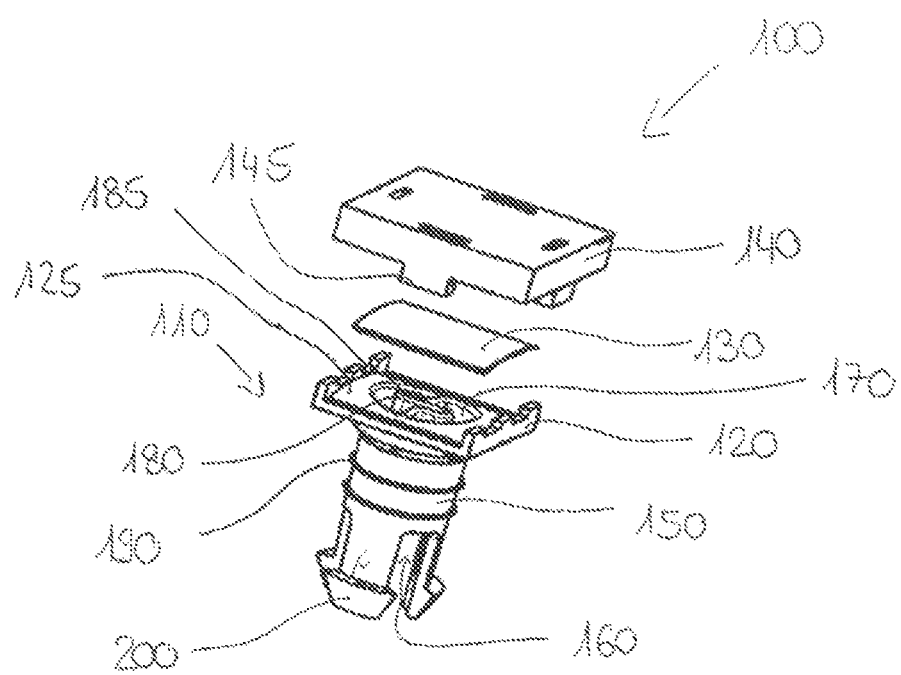
FIG. 1 a diagrammatic, perspective, exploded view of a pressure compensation element according to the invention.

FIG. 1 shows a pressure compensation element 100 in a perspective, exploded view. The pressure compensation element 100 shown in FIG. 1 is suitable for use in a casing (not shown) for electrical devices, and comprises a connecting body 110, a membrane 130, and an impact protection 140 configured as a lid, which is coupled to the connecting body 110 by means of snap connectors. The connecting body 110 is configured as a hollow body 150 and can be connected to the casing. At a free end, the hollow body 150 has a first opening 160 and a second opening 170 leading to a membrane seat 120, these openings being the end portions of a cavity penetrating through the hollow body 150 in the longitudinal direction.

When the pressure compensation element 100 is connected to the casing, the first opening 160 leads to the interior of the casing. In the exemplary embodiment shown, the first opening 160 is arranged opposite the second opening 170, wherein in principle the two openings 160, 170 may also be arranged differently.

The membrane seat 120 has a contact face 125 to which the second opening 170 leads. A spring element 180 abutting the contact face 125 is formed inside the second opening 170. A surface of the spring element 180 transforming into the contact face 125 forms a supporting contour 185 for the membrane 130. The supporting contour 185 and the contact face 125 of the membrane seat 120 together lie in one surface which, in the exemplary embodiment shown, is configured with a single curvature, namely formed as a portion of a cylinder casing surface. The spring element 180 is formed between two mutually opposing regions of the second opening 170, such that when a reduced pressure prevails in the casing interior due to dirt particles on the membrane 130, it is deformed elastically inward into the second opening 170 by the membrane 130, and when the reduced pressure in the casing interior diminishes, the membrane 130 is pressed back by the spring element 180 into its starting state, so that the dirt particles deposited on the membrane 130 are in motion and break down, whereby the permeability of the membrane 130 is restored. The spring element 180, in top view onto the second opening 170, has an S-shape.

Accordingly, the membrane 130 is also configured curved in a pressure-balanced starting state and follows the surface containing the supporting contour 185 of the spring element 180 and the contact face 125 of the membrane seat 120, such that the membrane 130 lies by form fit on the contact face 125 and the supporting contour 185. The impact protection 140 lies at least in portions on the membrane 130 such that, in addition to protecting the membrane 130 from the impact of foreign bodies or fluids, it assumes the function of securing the position of the membrane 130.

In particular, the membrane 130 is fixed by force fit by means of the impact protection 140 and the membrane seat 120. The membrane is preferably not otherwise attached, in particular the membrane 130 is not held by a weld or adhesive joint. Advantageously, in this case it can be removed from the membrane seat 120 and from the impact protection 140 without destruction. Thus the membrane 130 can be changed comparatively easily. This embodiment is also suitable for other exemplary embodiments of the pressure compensation element 100.

Figure 2:
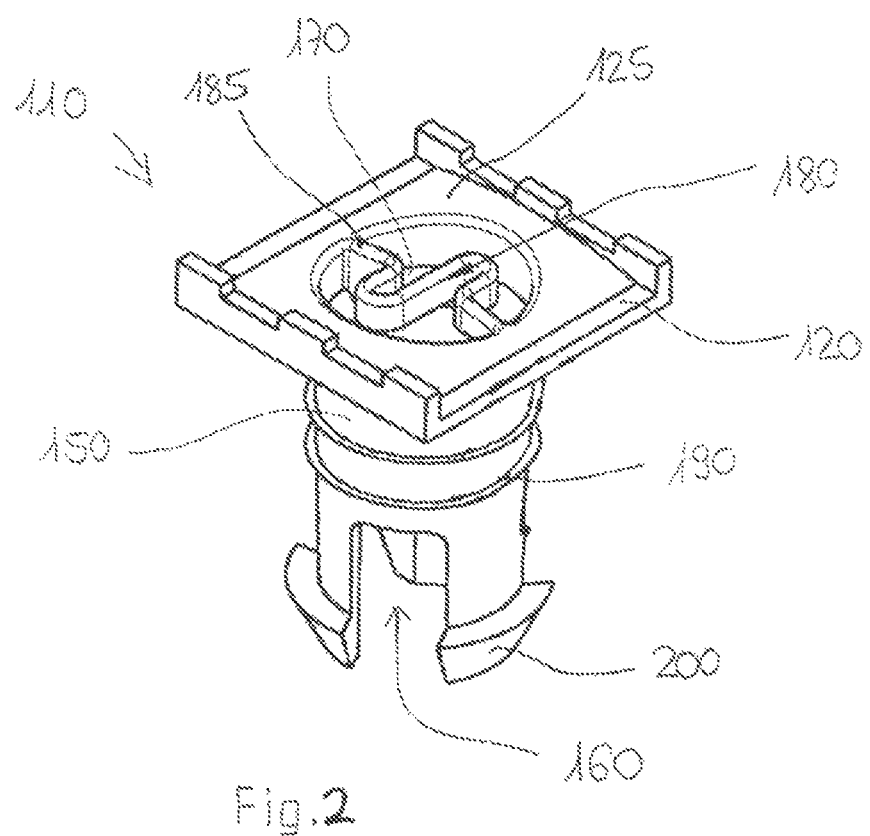
FIG. 2 a diagrammatic, perspective, detail view of a connecting body of the pressure compensation element in FIG. 1, and FIG. 3 a diagrammatic, perspective view of the pressure compensation element in FIG. 1 in assembled state.

As shown in particular in FIG. 2, in a detail view of the connecting body 110, the second opening 170 leads to the curved membrane seat 120. The second opening 170 contains the spring element 180 which, in top view onto the second opening 170, is configured curved corresponding to an S-contour. It forms an also S-shaped supporting contour 185 such that a gas-permeable membrane 130, also formed curved, can lie directly on the membrane seat 120 and the supporting contour 185 of the spring element 180. The impact protection 140 is arranged above the membrane 130 so that direct spraying of the membrane 130 by a fluid can be largely prevented.

Figure 3:
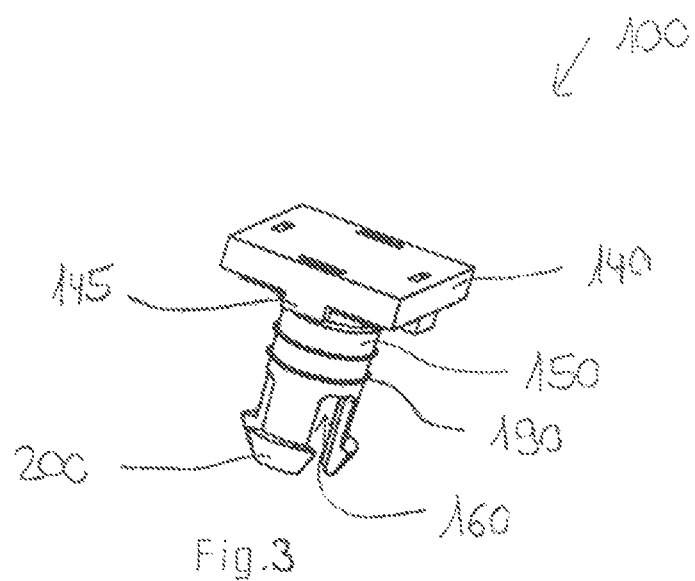

The impact protection 140 has catch elements 145 and can be connected thereby, as shown in FIG. 3, to the connecting body 110 such that firstly the position of the membrane 130 can be secured and secondly simple installation and removal of the impact protection 140 and hence also replacement of the membrane 130 can be guaranteed.

If, despite the impact protection 140 fitted, the membrane 130 is exposed to various solid particle deposits, a reduced air pressure will form inside the device during a temperature falling phase, whereby the membrane 130 is drawn into the second opening 170 against the pretensioned spring element 180. When the air in the casing interior heats up, for example due to operation of an electrical device, the resulting reduced air pressure will diminish. The pretension of the spring element 180 guarantees that the spring element 180 and hence the membrane 130 are returned to their original position. The solid particle deposits on the membrane 130 break down under the movement of the membrane 130, so that the air permeability of the membrane 130 is restored.

In principle, both the membrane seat 120 and the membrane 130 may be configured differently, wherein the membrane seat 120 described in the exemplary embodiment shown, and the membrane 130, have an outer contour rectangular in top view and are configured curved. Due to the rectangular outer contour, optimum use of the membrane material on automated production of the membrane 130 can be guaranteed. Furthermore, due to its larger surface area, the rectangular membrane 130 has a higher elasticity than for example a round membrane cross-section, whereby the service life of the membrane 130 is extended and hence the total costs for the pressure compensation element 100 can be reduced.

The connecting body 110 abutting the first opening 160 on the hollow body 150 has catch elements 200, wherein the catch elements 200 secure the seat of the connecting body 110 on the casing when the pressure compensation element 100 is mounted on the casing (not shown). Furthermore, in the exemplary embodiment shown, the connecting body 110 has two sealing elements 190, wherein the number of sealing elements 190 is variable and may be structured flexibly depending on the production process and area of use. The sealing elements 190 may either be applied additionally to the hollow body 150 or produced directly with the hollow body 150 in one production process. It is advantageous if the entire connecting body 110—and hence the hollow body 150, the sealing elements 190 and the membrane seat 120—are produced integrally in the injection molding process. In principle, it is also conceivable that the connecting body 110 also comprises the impact protection 140 and this is mounted foldably on the hollow body 140. In this case, a common production process would be possible in which both the connecting body 110 with the sealing elements 190 and the impact protection 140 are injection-molded, whereby amongst others production costs could be saved.

As well as the exemplary embodiment shown and described, further embodiments are conceivable which may comprise further derivations and combinations of features. The invention is not restricted to the exemplary embodiments by the description referring thereto. Rather, the invention comprises each new feature and each combination of features, which includes in particular any combination of features in the exemplary embodiments and the claims.

The invention claimed is:

1. A pressure compensation element for a casing, the pressure compensation element comprising:
   a membrane;
   an impact protection;
   a connecting body in the form of a hollow body, with a membrane seat having a contact face for the membrane;
   wherein the membrane seat is arranged on the connecting body and the impact protection is coupled to the connecting body;
   wherein the membrane is arranged on the contact face between the impact protection and the membrane seat;
   wherein the connecting body has a first opening arranged on a first free end, and a second opening leading to the contact face of the membrane seat; and
   wherein a spring element is arranged inside the second opening, abutting the contact face, which spring element is elastically deflectable by the membrane and forms a supporting contour for the membrane.

2. The pressure compensation element of claim 1, wherein
   the two openings comprise end portions of a cavity penetrating the hollow body;
   the membrane is curved inward into the cavity under the elastic deformation of the spring element when a reduced pressure prevails in the cavity relative to a side of the membrane facing away from the cavity, and the membrane is pressed back into its starting position under the spring force of the spring element when the reduced pressure in the cavity diminishes.

3. The pressure compensation element of claim 2, wherein the supporting contour of the spring element and the contact face of the membrane seat lie in one surface.

4. The pressure compensation element of claim 3, wherein the supporting contour of the spring element and the contact face of the membrane seat are curved.

5. The pressure compensation element of claim 4, wherein membrane is configured such that, in a pressure-balanced starting state, the membrane is form fit on the surface.

6. The pressure compensation element of claim 5, wherein the impact protection lies at least in portions on the membrane and constitutes a positional fixing of the membrane.

7. The pressure compensation element of claim 6, wherein the hollow body has at least one sealing element between the first opening and the membrane seat; wherein the sealing element is configured to seal the connecting body against the casing.

8. The pressure compensation element of claim 7, wherein at least one catch element is formed abutting the first opening on the hollow body, wherein the catch element secures the membrane seat of the connecting body on the casing.

9. The pressure compensation element of claim 8, wherein the membrane seat, the membrane and the impact protection each have a rectangular outer contour.

10. The pressure compensation element of claim 9, wherein the spring element is formed between two mutually opposing regions of the second opening such that, on a reduced pressure in the casing interior, the spring element is pressed into the second opening by the membrane, and that when the reduced pressure in the casing interior diminishes, the membrane is pressed back into its starting state by the spring element.

11. The pressure compensation element of claim 10, wherein the spring element is S-shaped.

12. The pressure compensation element of claim 11, wherein the first opening and the second opening lie opposite each other at the two ends of the hollow body.

13. A pressure compensation element for a casing, the pressure compensation element comprising:
   a membrane;
   an impact protection member; and
   a connecting body comprising a hollow body portion and a membrane seat having a contact face;
   wherein the membrane seat is arranged on the connecting body and the impact protection is coupled to the connecting body;
   wherein the membrane is arranged on the contact face between the impact protection and the membrane seat;
   wherein the connecting body has a first opening arranged on a first free end, and a second opening leading to the contact face of the membrane seat; and
   wherein a spring element is arranged inside the second opening, abutting and contacting the contact face, which spring element is elastically deflectable by the membrane and forms a supporting contour for the membrane.

14. The pressure compensation element of claim 13, wherein the two openings comprise end portions of a cavity in the hollow body, the membrane is curved inward into the cavity under the elastic deformation of the spring element when a reduced pressure exists in the cavity relative to a side of the membrane facing away from the cavity, and the membrane returns to a starting position under a spring force of the spring element when the reduced pressure in the cavity diminishes.

15. The pressure compensation element of claim 13, wherein the supporting contour of the spring element and the contact face of the membrane seat lie in one surface.

16. The pressure compensation element of claim 15, wherein the one surface is curved.

17. The pressure compensation element of claim 13, wherein the supporting contour of the spring element and the contact face of the membrane seat lie in one surface, and wherein the membrane is configured such that, in a pressure-balanced starting state, the membrane is form fit on the one surface.

18. The pressure compensation element of claim 13, wherein the impact protection member lies at least in portions on the membrane and constitutes a positional fixing of the membrane.

19. The pressure compensation element of claim 13, wherein the spring element is formed between two mutually opposing regions of the second opening such that, on a reduced pressure in the casing interior, the spring element is pressed into the second opening by the membrane, and that when the reduced pressure in the casing interior diminishes, the membrane is pressed back into a starting position by the spring element.

20. The pressure compensation element of claim 13, wherein the spring element is formed between two mutually opposing regions of the second opening, and includes an S-shape.

* * * * *